(12) United States Patent
Johnson

(10) Patent No.: US 7,230,959 B2
(45) Date of Patent: *Jun. 12, 2007

(54) TUNABLE LASER WITH MAGNETICALLY COUPLED FILTER

(75) Inventor: Brad V. Johnson, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 304 days.

This patent is subject to a terminal disclaimer.

(21) Appl. No.: 10/082,597

(22) Filed: Feb. 22, 2002

(65) Prior Publication Data

US 2003/0161360 A1    Aug. 28, 2003

(51) Int. Cl.
*H01S 3/10* (2006.01)
*H01S 3/08* (2006.01)

(52) U.S. Cl. .......................... 372/20; 372/37; 372/92; 372/98

(58) Field of Classification Search ................ 372/20, 372/92, 98, 37
See application file for complete search history.

(56) References Cited

U.S. PATENT DOCUMENTS

| | | | |
|---|---|---|---|
| 3,676,799 A * | 7/1972 | Danielmeyer | 372/32 |
| 3,788,743 A | 1/1974 | George | |
| 3,899,748 A | 8/1975 | Bodlaj | |
| 3,921,099 A | 11/1975 | Abrams et al. | |
| 3,965,440 A | 6/1976 | Graves | |
| 3,967,211 A | 6/1976 | Itzkan et al. | |
| 4,309,671 A | 1/1982 | Malyon | |
| 4,410,992 A | 10/1983 | Javan | |
| 4,460,977 A | 7/1984 | Shimada et al. | |
| 4,504,950 A | 3/1985 | AuYeung | |

(Continued)

FOREIGN PATENT DOCUMENTS

EP     0 849 846 A2    6/1998

(Continued)

OTHER PUBLICATIONS

Andalkar, A., et al., "Improved External Cavity Design for Cesium D1 (894 nm) Diode Laser," Review of Scientific Instruments, 2000 American Institute of Physics, Nov. 2000, vol. 71, No. 11, pp. 4029-4031.

(Continued)

*Primary Examiner*—James Menefee
(74) *Attorney, Agent, or Firm*—Blakely, Sokoloff, Taylor & Zafman LLP

(57) ABSTRACT

Laser apparatus and methods that permit actuation of a tuning element via a magnetically coupled drive assembly, and which provide for isolation of contamination-sensitive optical surfaces within a hermetically sealed enclosure with a magnetically coupled drive assembly that is external to the enclosure. The apparatus of the invention comprises a tuning element positioned in a light beam, and a drive element magnetically coupled to the tuning element. The apparatus may further comprise a hermetically sealed enclosure, with the tuning element positioned within the hermetically sealed enclosure, and the drive element located outside the hermetically sealed enclosure. The methods comprise positioning a tuning element in a light beam, magnetically coupling a drive element to the tuning element; and actuating the tuning element via magnetic coupling between the tuning element and the drive element. The methods may further comprise enclosing the tuning element in a hermetically sealed container.

35 Claims, 5 Drawing Sheets

U.S. PATENT DOCUMENTS

| | | | |
|---|---|---|---|
| 4,560,246 A | 12/1985 | Cotter | |
| 4,583,227 A | 4/1986 | Kirkby | |
| 4,730,105 A | 3/1988 | Mitschke et al. | |
| 4,770,047 A | 9/1988 | Arditty et al. | |
| 4,839,614 A | 6/1989 | Hill et al. | |
| 4,843,233 A | 6/1989 | Jeunhomme | |
| 4,847,854 A | 7/1989 | Van Dijk | |
| 4,870,269 A | 9/1989 | Jeunhomme et al. | |
| 4,932,782 A | 6/1990 | Graindorge et al. | |
| 4,934,816 A | 6/1990 | Silver et al. | |
| 4,994,677 A | 2/1991 | Graindorge | |
| 5,022,745 A | 6/1991 | Zayhowski et al. | |
| 5,028,395 A | 7/1991 | Sebille et al. | |
| 5,050,179 A | 9/1991 | Mooradian | |
| 5,058,124 A | 10/1991 | Cameron et al. | |
| 5,103,457 A | 4/1992 | Wallace et al. | |
| 5,115,677 A | 5/1992 | Martin et al. | |
| 5,124,993 A | 6/1992 | Braunlich et al. | |
| 5,141,316 A | 8/1992 | Lefevre et al. | |
| 5,163,063 A | 11/1992 | Yoshikawa et al. | |
| 5,172,185 A | 12/1992 | Leuchs et al. | |
| 5,181,078 A | 1/1993 | Lefevre et al. | |
| 5,181,214 A | 1/1993 | Berger et al. | |
| 5,185,643 A | 2/1993 | Vry et al. | |
| 5,218,610 A | 6/1993 | Dixon | |
| 5,222,070 A | 6/1993 | Niki | |
| 5,225,930 A | 7/1993 | Land et al. | |
| 5,245,626 A | 9/1993 | Burke et al. | |
| 5,251,222 A | 10/1993 | Hester et al. | |
| 5,270,791 A | 12/1993 | Lefevre et al. | |
| 5,289,491 A | 2/1994 | Dixon | |
| 5,305,330 A | 4/1994 | Rieder et al. | |
| 5,319,668 A | 6/1994 | Luecke | |
| 5,321,717 A | 6/1994 | Adachi et al. | |
| 5,327,447 A | 7/1994 | Mooradian | |
| 5,331,651 A | 7/1994 | Becker et al. | |
| 5,347,527 A | 9/1994 | Favre et al. | |
| 5,349,439 A | 9/1994 | Graindorge et al. | |
| 5,349,440 A | 9/1994 | DeGroot | |
| 5,373,515 A | 12/1994 | Wakabayashi et al. | |
| 5,387,974 A | 2/1995 | Nakatani | |
| 5,412,474 A | 5/1995 | Reasenberg et al. | |
| 5,412,676 A | 5/1995 | Schnier et al. | |
| 5,414,280 A | 5/1995 | Girmay | |
| 5,418,800 A | 5/1995 | Prior et al. | |
| 5,420,687 A | 5/1995 | Kachanov | |
| 5,428,700 A | 6/1995 | Hall | |
| 5,438,579 A | 8/1995 | Eda et al. | |
| 5,444,724 A | 8/1995 | Goto | |
| 5,450,202 A | 9/1995 | Tisue | |
| 5,473,625 A | 12/1995 | Hansen et al. | |
| 5,543,916 A | 8/1996 | Kachanov | |
| 5,583,638 A | 12/1996 | Cutler | |
| 5,594,744 A | 1/1997 | Lefevre et al. | |
| 5,606,439 A | 2/1997 | Wu | |
| 5,631,736 A | 5/1997 | Thiel et al. | |
| 5,673,129 A | 9/1997 | Mizrahi | |
| 5,696,785 A * | 12/1997 | Bartholomew et al. | 372/59 |
| 5,712,704 A | 1/1998 | Martin et al. | |
| 5,719,674 A | 2/1998 | Martin et al. | |
| 5,737,109 A | 4/1998 | Goodwin | |
| 5,751,750 A | 5/1998 | Friede et al. | |
| 5,760,391 A | 6/1998 | Narendran | |
| 5,777,773 A | 7/1998 | Epworth et al. | |
| 5,802,085 A | 9/1998 | Lefevre et al. | |
| 5,812,716 A | 9/1998 | Ohishi | |
| 5,825,792 A | 10/1998 | Villeneuve et al. | |
| 5,848,092 A | 12/1998 | Mitsumoto et al. | |
| 5,872,881 A | 2/1999 | Rossi et al. | |
| 5,886,785 A | 3/1999 | Lefevre et al. | |
| 5,917,188 A | 6/1999 | Atkinson et al. | |
| 5,943,352 A | 8/1999 | Fee | |
| 5,946,331 A | 8/1999 | Amersfoort et al. | |
| 5,991,061 A | 11/1999 | Adams et al. | |
| 5,999,546 A * | 12/1999 | Espindola et al. | 372/20 |
| 6,018,535 A | 1/2000 | Maeda | |
| 6,034,799 A | 3/2000 | Hansen | |
| 6,040,950 A | 3/2000 | Broome | |
| 6,043,883 A | 3/2000 | Leckel et al. | |
| 6,044,095 A | 3/2000 | Asano et al. | |
| 6,061,369 A | 5/2000 | Conradi | |
| 6,064,501 A | 5/2000 | Roberts et al. | |
| 6,081,539 A | 6/2000 | Mattori et al. | |
| 6,084,695 A | 7/2000 | Martin et al. | |
| 6,108,355 A * | 8/2000 | Zorabedian | 372/20 |
| 6,115,121 A | 9/2000 | Erskine | |
| 6,115,401 A | 9/2000 | Scobey et al. | |
| 6,151,337 A | 11/2000 | Carlsten et al. | |
| 6,181,717 B1 | 1/2001 | Kner et al. | |
| RE37,044 E | 2/2001 | Wu | |
| 6,192,058 B1 | 2/2001 | Abeles | |
| 6,201,638 B1 | 3/2001 | Hall et al. | |
| 6,205,159 B1 | 3/2001 | Sesko et al. | |
| 6,215,802 B1 * | 4/2001 | Lunt | 372/34 |
| 6,229,835 B1 | 5/2001 | Tomaru et al. | |
| 6,233,045 B1 | 5/2001 | Suni et al. | |
| 6,243,517 B1 | 6/2001 | Deacon | |
| 6,246,480 B1 | 6/2001 | O'Brien | |
| 6,249,364 B1 | 6/2001 | Martin et al. | |
| 6,249,365 B1 | 6/2001 | Mizrahi et al. | |
| 6,252,718 B1 | 6/2001 | Lefevre | |
| 6,259,712 B1 | 7/2001 | DeCain et al. | |
| 6,263,004 B1 | 7/2001 | Arvidsson et al. | |
| 6,282,215 B1 | 8/2001 | Zorabedian et al. | |
| 6,301,280 B1 | 10/2001 | Broutin et al. | |
| 6,304,586 B1 | 10/2001 | Pease et al. | |
| 6,314,116 B1 * | 11/2001 | Wright et al. | 372/20 |
| 6,321,011 B2 | 11/2001 | Deacon | |
| 6,324,204 B1 | 11/2001 | Deacon | |
| 6,330,253 B1 | 12/2001 | Tuganov et al. | |
| 6,331,892 B1 | 12/2001 | Green | |
| 6,337,660 B1 | 1/2002 | Esman et al. | |
| 6,366,592 B1 | 4/2002 | Flanders | |
| 6,366,689 B1 | 4/2002 | Rao et al. | |
| 6,396,023 B1 * | 5/2002 | Aikiyo | 219/117.1 |
| 6,404,538 B1 | 6/2002 | Chen et al. | |
| 6,441,933 B1 | 8/2002 | Jang | |
| 6,459,528 B1 * | 10/2002 | Cao | 359/341.2 |
| 6,470,036 B1 | 10/2002 | Bailey et al. | |
| 6,507,593 B1 * | 1/2003 | Spinelli et al. | 372/20 |
| 6,532,091 B1 | 3/2003 | Miyazaki et al. | |
| 6,633,595 B1 * | 10/2003 | Gries et al. | 372/22 |
| 6,658,031 B2 | 12/2003 | Tuganov et al. | |
| 6,717,965 B2 * | 4/2004 | Hopkins et al. | 372/20 |
| 6,724,797 B2 | 4/2004 | Daiber | |
| 6,754,243 B2 * | 6/2004 | Missey et al. | 372/20 |
| 6,788,724 B2 * | 9/2004 | Sell et al. | 372/92 |
| 6,804,278 B2 | 10/2004 | Daiber et al. | |
| 2002/0048297 A1 | 4/2002 | Irie et al. | |
| 2002/0126345 A1 | 9/2002 | Green et al. | |
| 2002/0136104 A1 | 9/2002 | Daiber | |

FOREIGN PATENT DOCUMENTS

| | | |
|---|---|---|
| EP | 0924628 | 8/1998 |
| WO | WO 98/05105 | 2/1998 |
| WO | WO 98/44424 | 10/1998 |
| WO | WO 00/49689 | 8/2000 |
| WO | WO 01/04999 A1 | 1/2001 |
| WO | WO 02/21414 A1 | 3/2002 |
| WO | WO 02/078137 A1 | 10/2002 |
| WO | WO 03/005500 A2 | 1/2003 |
| WO | WO 03/005501 A2 | 1/2003 |

WO  WO 03/005512 A2  1/2003

OTHER PUBLICATIONS

Ichihashi, Y., et al., "130 GHz Frequency Sweep Over a 30 nm Tuning Range Without Mode Hopping by an External-Cavity Semiconductor Laser," IEICE Transactions on Communications, Jun. 1992, Yokyo, Japan, vol. E75-B, No. 6, pp. 521-523.

Ketelsen, L.J.P., "Simple Technique for Measuring Cavity Loss in Semiconductor Lasers," Electronics Letters, Aug. 18, 1994, vol. No. 17, pp. 1422-1423.

Shtengel, G.E., et al., "Internal Optical Loss Measurements in 1.3 μm inGaAsP Lasers," Electronics Letters, Jul. 6, 1995, vol. 31, No. 14, pp. 1157-1159.

Favre, et al. "External-Cavity Semiconductor Laser with 15 nm Continuous Tuning Range", Electronics Letters, Jun. 19, 1996.

MacLeod, H.A. *Thin Film Optical Filters* 2$^{nd}$ Edition, McGraw-Hill, 1989, pp. 244-269.

Mellis et al. "Miniature Packaged External-Cavity Semiconductor Laser With 50 Ghz Continuous Electical Tuning Range" Electronics Letters, Apr. 22, 1988.

Rosenberg, K.P. et al. "Logarithmically Variable Infrared Etalon Filters," SPIE, vol. 2262/223, pp. 223-232.

Scobey & Stupik, Stable Ultra-Narrow Bandpass Filters, SPIE, vol. 2262, pp. 37-46.

Takashashi, H. "Temperture Stability of Thin-Film Narrow-Bandpass Filters Produced by Ion-Assisted Deposition" Applied Optics, vol. 34, No. 4, Feb. 1, 1995.

Zhang, X.X., "An Interference Filter Based External Cavity Laser For Dense Wavelength Division Multiplexing Applications" Coring OCA Corp. pp. 103-108.

* cited by examiner

TUNABLE LASER WITH MAGNETICALLY COUPLED FILTER

BACKGROUND OF THE INVENTION

The demand for increased bandwidth in fiberoptic telecommunications has driven the development of sophisticated transmitter lasers usable for dense wavelength division multiplexing (DWDM) systems wherein multiple separate data streams propagate concurrently in a single optical fiber. Each data stream is created by the modulated output of a semiconductor laser at a specific channel frequency or wavelength, and the multiple modulated outputs are combined onto the single fiber. The International Telecommunications Union (ITU) presently requires channel separations of approximately 0.4 nanometers, or about 50 GHz, which allows up to 128 channels to be carried by a single fiber within the bandwidth range of currently available fibers and fiber amplifiers. Greater bandwidth requirements will likely result in smaller channel separation in the future.

DWDM systems have largely been based on distributed feedback (DFB) lasers operating with a reference etalon associated in a feedback control loop, with the reference etalon defining the ITU wavelength grid. Statistical variation associated with the manufacture of individual DFB lasers results in a distribution of channel center wavelengths across the wavelength grid, and thus individual DFB transmitters are usable only for a single channel or a small number of adjacent channels.

Continuously tunable external cavity lasers have been developed to overcome this problem. The advent of continuously tunable telecommunication lasers has introduced additional complexity to telecommunication transmission systems, as individual lasers must be able to provide stable, accurate tuning at narrowly separated channel wavelengths. Particularly, the tuning aspects of external cavity lasers involve multiple optical surfaces that are sensitive to contamination and degradation during use. Further, external cavity laser tuning typically involves drive elements that can introduce contaminants to the laser optical surfaces. These deficiencies have resulted in increased costs and decreased performance lifetimes for tunable telecommunication transmitter lasers.

SUMMARY OF THE INVENTION

The invention provides laser and optical devices, tuning assemblies therefore, and related methods that permit actuation of a tuning element via a magnetically coupled drive assembly, and which provide for isolation of contamination-sensitive optical surfaces within a hermetically sealed enclosure with a magnetically coupled drive assembly that is external to the enclosure. In general terms, the apparatus of the invention comprises a tuning element positioned in a light beam, and a drive element magnetically coupled to the tuning element. The apparatus may further comprise a hermetically sealed enclosure, with the tuning element positioned within the hermetically sealed enclosure, and the drive element located outside the hermetically sealed enclosure. More specifically, the apparatus may comprise a first magnetic element coupled to the tuning element and located within the hermetically sealed enclosure, and a second magnetic element associated with the drive element and located outside the hermetically sealed enclosure, with the first magnetic element magnetically coupled to the second magnetic element through a wall or side of the hermetically sealed enclosure.

In certain embodiments, the apparatus may further comprise a gain medium configured to emit the light beam, and a reflector positioned in the light beam after the tuning element. The apparatus may additionally comprise a grid generator associated with the light beam and configured to define a channel or communication grid.

The invention also provides a laser apparatus comprising a gain medium, a tuning element positioned in a light beam emitted by the gain medium, a first magnetic element operatively coupled to the tuning element, and a second magnetic element magnetically coupled to the first magnetic element and configured to actuate the first magnetic element and the tuning element according to actuation of the second magnetic element. The laser apparatus may further comprise a drive element coupled to the second magnetic element and configured to actuate the second magnetic element. A reflector may be included and positioned in the light beam after the tuning element, and a grid generator may be positioned in the light beam. In certain embodiments, the laser apparatus may comprise a hermetically sealed enclosure, with the gain medium, tuning element and first magnetic element positioned within the hermetically sealed enclosure, and the second magnetic and drive element located outside the hermetically sealed enclosure. The hermetically sealed enclosure may include an inert atmosphere, an activated carbon drain, and a moisture trap therewithin. In certain embodiments, the apparatus of the present invention comprises a plurality of magnetic elements coupled to the drive element and tuning element to actuate the tuning element.

The invention additionally provides a method for operating a laser, comprising positioning a tuning element in a light beam, magnetically coupling a drive element to the tuning element; and actuating the tuning element via magnetic coupling between the tuning element and the drive element. The magnetically coupling may comprise coupling a first magnet to the tuning element, coupling a second magnet to the drive element, and positioning the first and second magnets such that actuation of the second magnet by the drive element results in corresponding actuation of the first magnet and the tuning element. The method, in certain embodiments, may further comprise enclosing the tuning element in a hermetically sealed container, and positioning the drive element outside the hermetically sealed container, with the magnetic coupling carried out through a wall of the hermetically sealed container. The method may additionally comprise providing a gain medium configured to emit the light beam, positioning a reflector in the light beam after the tuning element, and positioning a grid generator in the light beam. The gain medium, reflector and grid generator may be positioned within the hermetically sealed enclosure.

In other embodiments, the method of the invention may comprise positioning a tuning element in a light beam, coupling a first magnetic element to the tuning element, coupling a second magnetic element to a drive element, and positioning the first and second magnetic elements such that the tuning element and the drive element are magnetically coupled to each other. The method may also comprise actuating the tuning element via interaction of the magnetically coupled first and second magnetic elements. In certain embodiments, the method may comprise positioning the tuning element and the first magnetic element within a hermetically sealed enclosure, and positioning the drive element and the second magnetic element outside the hermetically sealed enclosure. The method may additionally comprise providing a gain medium, the gain medium emitting the light beam, positioning a reflector positioned in the light beam after the tuning element, and positioning the gain medium and the reflector within the hermetically sealed enclosure.

The invention is particularly useful for external cavity laser apparatus that comprise a gain medium and an end reflector, together with a tunable element that is tuned or adjusted by positional actuation. The gain medium may comprise a diode emitter chip including first and second output facets, with an anti-reflective coating on the second output facet. The first output facet and the end mirror define an external cavity, with the gain medium emitting a coherent beam from the second output facet along an optical path in the external cavity to the end reflector.

The use of a hermetically sealable container in accordance with the invention permits enclosing an external cavity laser within a contamination-free or low contamination environment, in an inert atmosphere, which protects the anti-reflective (AR) coating on the gain medium, as well as optical surfaces on the end reflector, tuning element and other optical components. The deposition of contaminants onto optical associated with an external cavity laser, which may occur in the absence of hermetic sealing, can result in aberrations which hinder the performance of the external laser cavity and promote degradation of critical optical surfaces.

The invention provides for magnetically coupling a drive element or assembly that is external to a hermetically sealed container, to a tunable element within the hermetically sealed container, such that the tuning element can be magnetically actuated by the drive assembly while potential contaminants associated with the drive assembly are external to the hermetically sealed container. Many of the components associated with drive assemblies, such as lubricants, adhesives, cable insulators and plasticized parts, can have high outgassing characteristics during laser operation such that volatile hydrocarbons are emitted from the drive assembly. The magnetic coupling of a tuning element within a hermetically sealed enclosure, by a drive assembly located outside of the enclosure, eliminates the risk of laser optical surface contamination by drive assembly components.

In certain embodiments, one or more activated carbon drains may be included within the hermetically sealed enclosure and positioned to collect volatile hydrocarbons produced by outgassing from components of the external cavity laser. The activated carbon drain has a large surface area of activated carbon that allows for adsorbing or trapping the outgassing volatile organic compounds that occur during the operation of the laser. Organic hydrocarbon materials released from epoxies and lubricants used during the assembly of the external cavity laser or utilized in sealing the hermetically sealable enclosure are also trapped by the activated carbon drain. The activated carbon drain allows the optical surfaces of the tunable external cavity laser to remain free of organic contaminants in the hermetically sealed enclosure that would otherwise hinder performance.

In other embodiments, one or more moisture traps may be included within the hermetically sealable container and positioned to collect water vapor that may outgas from polyimide or other moisture holding insulator or material present in the external cavity laser. Such outgassed water vapor, if not trapped, may condense on critical optical surfaces and reduce performance of the external cavity laser, and may promote corrosion of components. Moisture condensation is particularly a concern after "cooldown" periods when the laser has not been in use. The material of the moisture trap may comprise a variety of desiccants. The moisture trap prevents condensation of water on optical surfaces and elsewhere that would otherwise reduce performance in the operation of the external cavity laser and promote corrosion of laser components within the hermetically sealed enclosure.

In one embodiment, the inert atmosphere sealed within the hermetically sealed container comprises nitrogen. Other inert gases may also be enclosed in the hermetically sealed enclosure such as helium, argon, krypton, xenon, or various mixtures thereof, including a nitrogen-helium mix, a neon-helium mix, a krypton-helium mix, or a xenon-helium mix. Helium may be added to the inert atmosphere to allow for testing and monitoring the level of hermeticity of the sealed container. The inert gas or gas mix included within the hermetically sealed container may be selected for a particular refractive index or other optical property.

A sacrificial surface may be included within the hermetically sealed enclosure in which both condensation and volatile hydrocarbons from outgassing are trapped upon to avoid contamination of the optical services of the tunable external cavity laser. The sacrificial surface is configured to remain cooler than surrounding surfaces during laser operation, and may be actively cooled by a cooling source and/or be made of material which provides passive cooling by acting as a heat sink which will attract volatile hydrocarbons and water vapor.

In certain embodiments, selective heating of important optical surfaces may be employed to prevent condensation of contaminants thereon. Such heating may be employed during cool-down periods when the gain medium is not powered, to prevent condensation when the external cavity laser is not in use. One or more heat sources, either positioned internally or externally to the hermetically sealed enclosure, may be used to heat the gain medium of the external cavity laser when the gain medium is not powered, in order to maintain a relatively high temperature for the anti-reflective coating on the output facet of the gain medium to prevent condensation thereon when the laser is not in use. Heating in this manner may also be used in connection with the end mirror, tunable elements or other components with sensitive optical surfaces to maintain a temperature higher than the activated carbon drain, moisture trap and/or the sacrificial surface present in the hermetically sealed container, to further prevent the contamination of these optical surfaces.

The invention may be embodied in a telecommunication laser system which comprises an optical fiber extending into the hermetic container through a hermetic fiberoptic feedthrough and optically coupled to an output facet of the external cavity laser to receive optical output therefrom. The hermetically sealable container may vary in configuration, but will generally be configured such that the optical fiber can be feed through a side of the hermetically sealable container. Various electrical leads necessary for operation of the external cavity laser, may extend into the hermetic container through hermetic feedthroughs in the sides of the hermetic enclosure.

BRIEF DESCRIPTIONS OF THE DRAWINGS

DETAILED DESCRIPTION

Referring more specifically to the drawings, for illustrative purposes the present invention is embodied in the apparatus and method shown in FIG. 1 through FIG. 5. It will be appreciated that the apparatus may vary as to configuration and as to details of the parts, and that the method may vary as to details and the order of the acts, without departing from the basic concepts as disclosed herein. The invention is disclosed primarily in terms of an external cavity diode laser (ECDL) used as a telecommunication transmitter laser. However, it will be readily apparent to those skilled in the art that the invention may be used with a variety of other laser devices and optical systems. It also should be understood that the terminology used herein is for the purpose of describing particular embodiments only, and is not intended to be limiting.

Figure 1A:
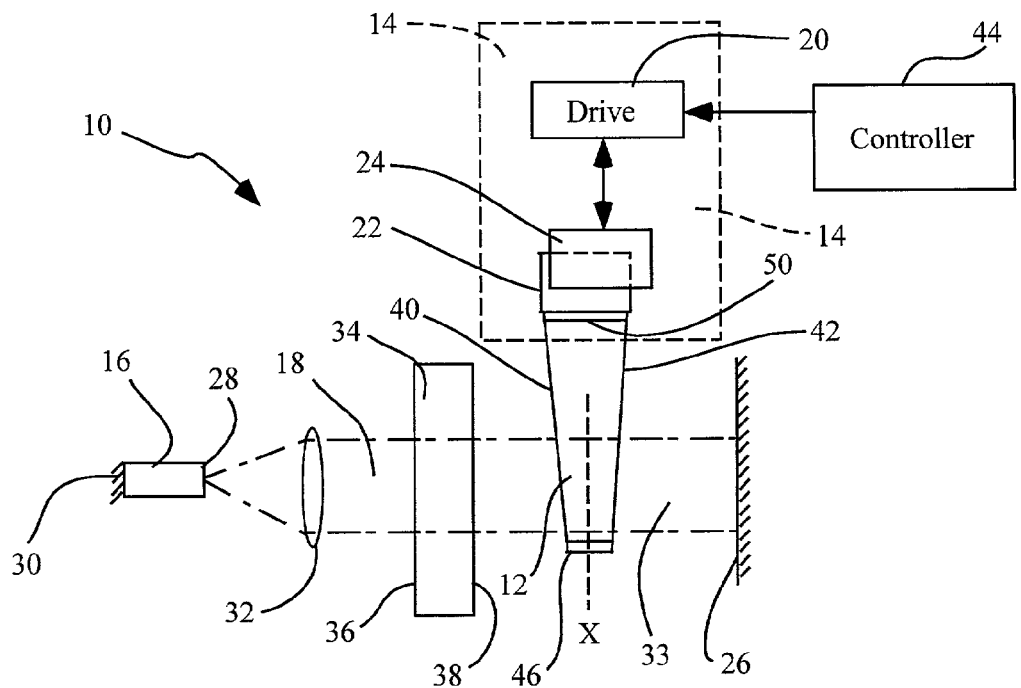
FIG. 1A and FIG. 1B are schematic diagrams of a laser apparatus with a magnetically actuated tuning element in accordance with the invention, showing the tuning element in two different positions.
Figure 1B:
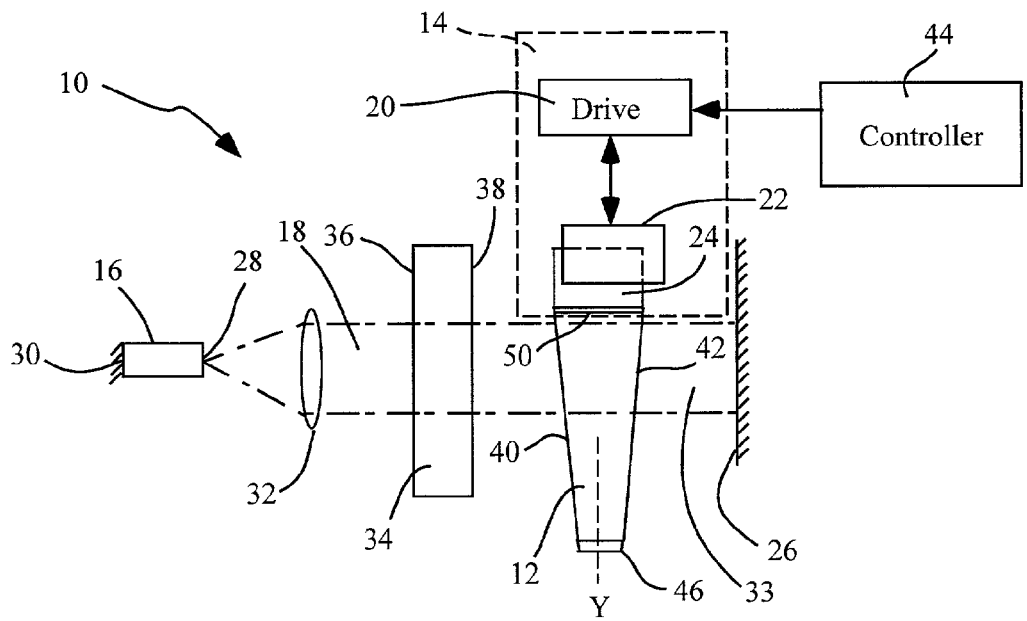

Referring now to FIGS. 1A and 1B, there is shown a laser apparatus 10 comprising a tuning element 12, and a drive assembly 14 that is magnetically coupled to tuning element 12 and configured to drive or actuate the tuning element 12. The apparatus 10 includes a gain medium 16 configured to emit a light beam 18, with tuning element 12 positioned in the light beam 18. Drive assembly 14 includes a drive element 20 that is magnetically coupled to the tuning element 12 by a first magnetic element 22 coupled to tuning element 12, and a second magnetic element 24 coupled to or otherwise associated with the drive element 20. The magnetic coupling is provided by the magnetic interaction of second magnetic element 24 with the first magnetic element 22, such that actuation of the second magnetic element provides a corresponding actuation of the first magnetic element 22, and hence the tuning element 12. In other words, actuation of drive element 20 provides a corresponding actuation to tuning element 12 through the magnetic coupling or interaction of magnetic elements 22, 24.

The term "magnetic element" as used herein refers to magnets as well as ferric elements or like components that are not themselves magnetic, but which are responsive to a magnetic field or the action of a magnet. Thus, only one the magnetic elements 22, 24 must be a magnet, while the other element may be a ferric element or component that is responsive to a magnet. In some embodiments, first magnetic element 22 may be joined directly to tuning element 12, with second magnetic element 24 joined directly to drive element 20. In other embodiments, magnetic elements 22, 24 may be indirectly coupled to tuning element 12 and drive element 20 via brackets, linkages or other support elements or assemblies (not shown). The magnetic elements 22, 24 represent as shown in FIGS. 1A and 1B represent only one possible magnetic coupling arrangement that may be used with the invention.

Magnetic elements 22, 24 need not be in contact during actuation of tuning element 12 by drive element. The use magnetic coupling with non-contacting magnetic elements advantageously allows gain medium 16 and tuning element, as well as other laser components, to be hermetically isolated from drive element 20, as described further below.

As shown, the apparatus 10 also includes a reflector or end mirror 26 positioned in the light beam 18 after the tuning element 12. Gain medium 16 may comprise a conventional Fabry-Perot diode emitter chip that has an anti-reflection (AR) coated front facet 28 and a reflective or partially reflective rear facet 30. Rear facet 30 and end mirror 26 together define an external laser cavity. Gain medium 16 emits beam 18 from front facet 28, with beam 18 collimated by lens 32 to define an optical path 33 that is co-linear with the optical axis of the external cavity. Front and rear facets 30, 32 of gain medium 16 are aligned with the optical axis of the external cavity as well. Conventional output optics (not shown) may be associated with rear facet 32 for coupling the output of laser apparatus 10 into an optical fiber.

The external cavity laser apparatus 10 includes a grid generator element that is shown in FIGS. 1A and 1B as a grid etalon 34. Grid etalon 34 has parallel reflective faces 36, 38, and operates as an interference filter, with the refractive index of grid etalon 28 and the optical thickness of grid etalon 28 as defined by the spacing of faces 36, 38 give rise to a multiplicity of minima within the communication band at wavelengths which coincide with the center wavelengths of a selected wavelength grid which may comprise, for example, the ITU (International Telecommunications Union) grid. Other wavelength grids may alternatively be selected. Grid etalon 34 has a free spectral range (FSR) that corresponds to the spacing between the grid lines of the ITU grid, and the grid etalon 34 thus operates to provide a plurality of pass bands centered on each of the gridlines of the wavelength grid. Grid etalon 34 has a finesse (free spectral range divided by full width half maximum or FWHM) that suppresses neighboring modes of the external cavity laser between each channel of the wavelength grid.

Grid etalon 34 may be a parallel plate solid, liquid or gas spaced etalon, and may be tuned by precise dimensioning of the optical thickness between faces 36, 38 by thermal expansion and contraction via temperature control. The grid etalon 34 may alternatively be tuned by tilting to vary the optical thickness between faces 36, 38, or by application of an electric field to an electrooptic etalon material. Grid etalon 34 may be thermally controlled to prevent variation in the selected grid that may arise due to thermal fluctuation during operation of external cavity laser 10. Grid etalon 28 alternatively may be actively tuned during laser operation as described in the U.S. patent application Ser. No. 09/900,474 filed on Jul. 6, 2001 and incorporated herein by reference. Various other types of grid generator other than a grid etalon may be used with external cavity laser 10.

Tuning element 12 is shown in FIGS. 1A and 1B as a tapered or wedge-shaped etalon 12 positioned in optical path 33 between grid etalon 34 and end mirror 26. Grid etalon 34 may alternatively be positioned in optical path 33 after tunable element 12 or elsewhere in optical path 33. Tuning etalon 12 also acts as an interference filter, with non-parallel reflective faces 40, 42 providing a tapered shape to etalon 12. Tuning etalon 12 may comprise, for example, a tapered transparent substrate, a tapered air gap between the reflective surfaces of adjacent transparent substrates, a thin film "wedge" interference filter, or other etalon structure. Tuning etalon 12 is configured to define pass bands are substantially broader than the pass bands of the grid etalon 34, with the broader pass bands of the tuning etalon 12 a periodicity substantially corresponding to the separation between the shortest and longest wavelength channels defined by the grid etalon 34. In other words, the free spectral range of the tuning etalon 12 corresponds to the full wavelength range of the wavelength grid defined by grid etalon 34. Tuning etalon 12 has a finesse that suppresses channels adjacent to a particular selected channel.

The tuning etalon 12 is used to select between multiple communication channels by changing the optical thickness between faces 40, 42 of tuning etalon 12. This is achieved by translating or driving tuning etalon 12 along axis x, which is generally parallel to the direction of taper of tuning etalon 12 and perpendicular to optical path 33 and the optical axis of external cavity laser 10. Each of the pass bands defined by tuning etalon 12 supports a selectable channel, and as the tuning etalon 12 is advanced or translated into optical path 33, the beam traveling along optical path 33 passes through increasingly thicker portions of tuning etalon 12 which support constructive interference between opposing faces 40, 42 at longer wavelength channels. As tuning etalon 12 is withdrawn from optical path 33, the beam will experience increasingly thinner portions of tuning etalon 12 and expose pass bands to the optical path 33 that support correspondingly shorter wavelength channels. The free spectral range of tuning etalon 12 corresponds to the complete wavelength range of grid etalon 34 as noted above, so that a single loss minimum within the communications band can be tuned across the wavelength grid. The combined feedback to gain medium 16 from the grid etalon 34 and tuning etalon 12 support lasing at the center wavelength of a selected channel. Across the tuning range, the free spectral range of the tuning element 12 is broader than that of grid etalon 34.

Tuning etalon 12 as shown in FIGS. 1A and 1B represents only one type of tunable element or channel selector that may be used with the invention. Etalon 12 may be replaced with a variety of tunable elements other than an etalon, such as grating devices, prisms, electro-optic devices, and movable reflectors used in conjunction with gratings or prisms. The use of a tapered air gap etalon as a channel selector is described in U.S. Pat. No. 6,108,355, wherein the "wedge" is a tapered air gap defined by adjacent substrates. The use of pivotally adjustable grating devices as channel selectors tuned by grating angle adjustment and the use of an electro-optic tunable channel selector in an external cavity laser and tuned by selective application of voltage are described in U.S. patent application Ser. No. 09/814,464 filed on Mar. 21, 2001. The use of a translationally tuned graded thin film interference filter is described in U.S. patent application Ser. No. 09/814,464 filed on Mar. 21, 2001 and U.S. patent application Ser. No. 09/900,412 filed on Jul. 6, 2001. The aforementioned disclosures are incorporated herein by reference. Various other tunable elements usable with external cavity lasers will suggest themselves to those skilled in the art, and are also considered to be within the scope of this disclosure.

The relative size, shape and distances between the various optical components of laser 10 as shown are in some instances exaggerated for clarity and are not necessarily shown to scale. The apparatus 10 may include additional components (not shown) that are common in external cavity lasers, such as focusing and collimating components, and polarizing optics configured to remove spurious feedback associated with the various components of apparatus 10.

Tuning etalon 12 is positionally tuned by drive assembly 14, with drive element 20 structured and configured to adjustably position tuning element 12 according to selected channels via magnetic coupling as described above. Drive element 20 may comprise, for example a stepper motor together with suitable hardware for precision translation of tuning element 12. Drive element 20 may alternatively comprise various types of actuators, including, but not limited to, DC servomotors, solenoids, voice coil actuators, piezoelectric actuators, ultrasonic drivers, shape memory devices, and like linear actuators.

Drive element 20 is operatively coupled to a controller 44 that provides signals to control the positioning of tuning element 12 by drive element 20. Controller 44 may include a data processor and memory (not shown) wherein are stored lookup tables of positional information for tuning element 12 which correspond to selectable channel wavelengths. Controller 44 may be internal to drive element 20, or may be external and shared in other component positioning and servo functions of the laser apparatus 10.

When laser apparatus 10 is tuned to a different communication channel, controller 44 signals drive element 20 according to positional data in the stored look up table, and drive element 20 translates or otherwise drives tuning element 12 to the correct position via magnetic coupling elements 22 and 24, wherein the optical thickness of the portion of the tapered etalon 12 positioned in optical path 33 provides constructive interference which supports the selected channel. A linear encoder (not shown) may be used in association with tuning etalon 12 and drive element 20 to ensure correct positioning of tuning element 12 by driver 20. FIG. 1A shows a relatively thin portion of etalon 12 positioned in optical path 33, while FIG. 1B shows a thicker portion of etalon 12 positioned in optical path 33. The two positions of etalon 12 shown in FIG. 1A and FIG. 1B provide feedback to gain medium 12 at different wavelengths. The tuning of an external cavity laser using tapered etalon is described further in U.S. patent application Ser. No. 09/814,464, noted above.

During tuning of tuning element 12, the length of the laser external cavity may also be tuned by positional adjustment of end mirror 26 using another tuning mechanism (not shown). In this regard, end mirror 26 is also a tunable element and may be tuned via a magnetic coupling mechanism (not shown). Other tuning mechanisms for adjustment of end mirror may comprise, for example, a DC servomotor, solenoid, voice coil actuator, piezoelectric actuator, ultrasonic driver, shape memory device, or other type of actuator. In certain embodiments, end mirror 26 may be positioned using selective heating or cooling of a compensating element coupled to the end mirror, as disclosed in U.S. patent application Ser. No. 09/900,443 filed on Jul. 6, 2001 and incorporated herein by reference. The tuning of an external laser cavity with an electro-optic element according to error signals derived from voltage monitored across a gain medium is described in U.S. patent application Ser. No. 09/900,426 filed on Jul. 6, 2001 and incorporated herein by reference.

Tuning etalon 12 may include opaque regions 46, 50 at its ends that are optically detectable and which serve to verify the position of tuning element 12 when it has been positionally tuned to its longest or shortest channel wavelength. Opaque regions provide an additional encoder mechanism usable in the positional tuning of the tuning element. When tuning element 12 is moved into a position such that one of opaque regions 46, 48 enters optical path 33, the opaque region 46, 50 will block or attenuate the beam along the optical path. This attenuation of light is detectable, as described further below. Since the location of opaque regions on tuning element 12 can be determined with precision, controller 44 can anticipate when an opaque region 46, 50 will enter optical path 33. Appearance of an opaque region 46, 48 in optical path 33 at a point other than predicted will indicate an encoder error, and the controller 44 can make an appropriate correction based on the detected presence of an opaque region 46, 50 in optical path 33. Additional opaque regions (not shown) may be included elsewhere on tuning element 12.

Figure 2:
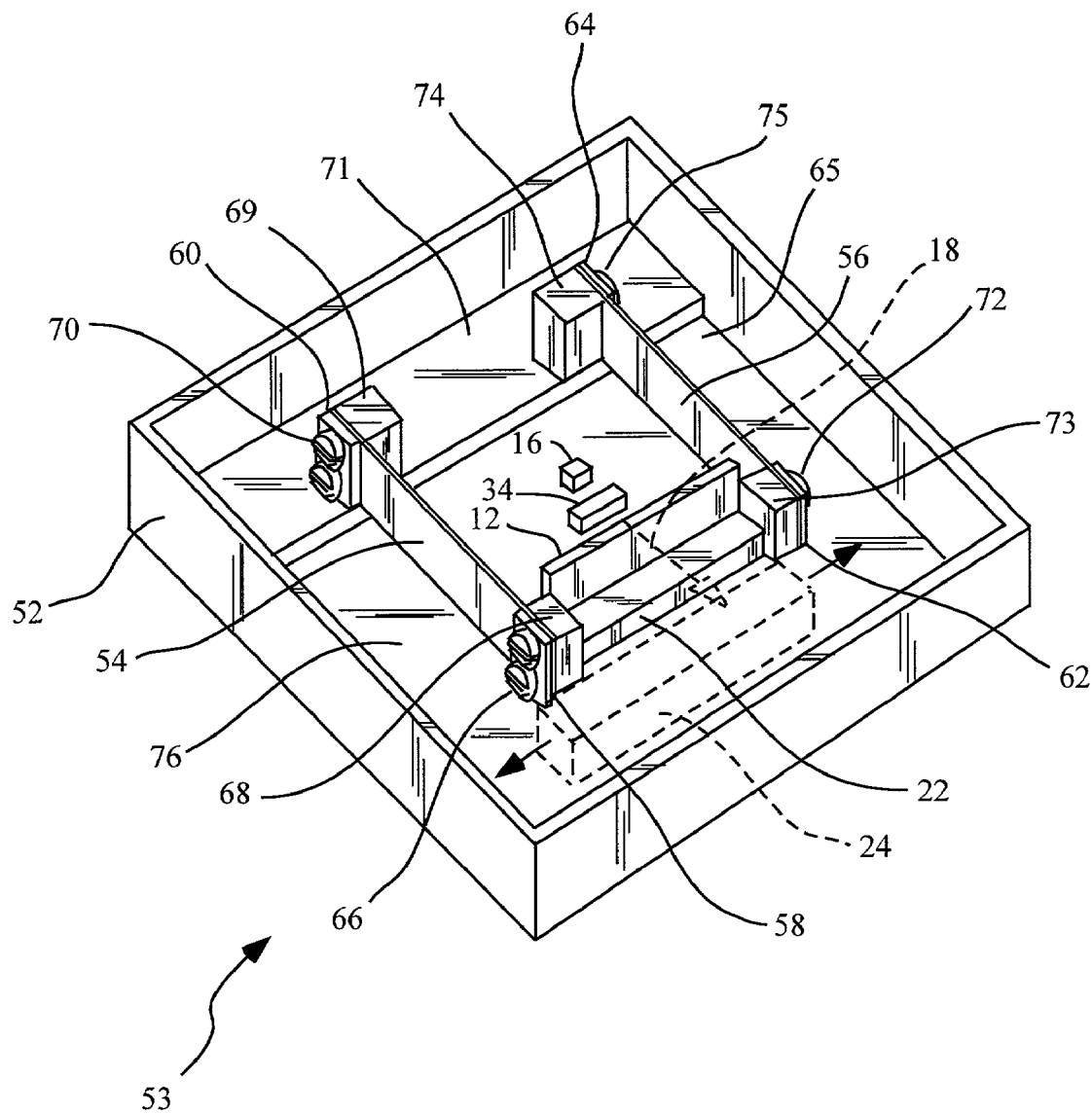
FIG. 2 is a perspective view of a laser apparatus with a magnetically actuated tuning assembly together with a hermetically sealed enclosure.

The magnetic coupling of a drive mechanisms to a tunable element of a laser as provided by the invention allows isolation of the tunable element and other laser components from contaminants associated with a mechanical drive mechanism, such as lubricants, plasticizers from power cable insulation, solder residues, and like volatile materials that may be present in a drive assembly. Thus, in certain embodiments, the laser apparatus of the invention may comprise a hermetically sealed enclosure 52 as shown in FIGS. 2–5, with the gain medium 16, tuning element 12 and first magnetic element 22 positioned within the hermetically sealed enclosure 52, and the second magnetic element 24 and drive element 20 located outside the hermitically sealed enclosure 52. The first magnetic element 22 magnetically coupled to the second magnetic element 24 through a wall of the hermetically sealed enclosure as shown in FIG. 2.

Referring more particularly to FIG. 2, there is shown a laser apparatus 53 with a magnetically actuated tuning element 12 together with a hermetically sealed enclosure 52, wherein like reference numbers are used to denote like parts. The lid or top cover of container 52 is omitted clarity. In this embodiment of the invention, the tuning element 12 and first magnetic element 22 are supported by a suspension/guidance system that is provided by flexure elements 54, 56. As shown, a first flexure element 54 has a first end 58 coupled to first magnetic element 22 and a second end 60 coupled to the sealable container 52, and a second flexure element 56 with a first end 62 coupled to first magnetic element 22 and a second end 64 coupled to the sealable container 52. The first and second flexure elements 54, 56 and first magnetic element 22 are configured to allow controlled motion of the first magnetic element 22 by magnetic interaction or coupling with second magnetic element 24, to provide for actuation of tuning element 12.

Magnetic elements 22, 24 are separated from each other by the bottom wall 65 of container 52. Bottom wall 65 comprises a non-ferric metal or metal alloy, and does not interfere with the interaction of magnetic elements 22, 24. Copper-tungsten alloy(s) provides non-magnetic material that has high thermal conductivity, and thus allows interaction of magnetic elements 22, 24 as described above, as well as provide for heat dissipation associated with the operation of gain medium 12 within enclosure. The portions of enclosure 52 other than bottom wall 65 may also comprise a copper-tungsten, alloy, or may comprise KOVAR® alloy or other material suitable for hermetically sealed enclosures. Various other metals and metal alloys usable for bottom wall 65 and the other portions of enclosure 52 will suggest themselves to those skilled in the art.

The first end 58 of first flexure element 54 is coupled to first magnetic element 22 by screws 66 and bracket 68. The first flexure element 54 is joined to container 52 by coupling second end 60 to a flexure support mount 69 by screws 70. Support mount 69 in is mounted on a base plate 71, which in turn is mounted on container wall 65. The second flexure element 56 similarly is coupled at its first end 62 to first magnetic element 22 by screws 72 and bracket 73, and with second end 64 joined to support mount 74 by screws 75. Support mount 74 is joined to base plate 71. Tuning element 12 is mounted on magnetic element 22 by adhesive or conventional coupling hardware (not shown). Gain medium 16 is positioned to direct light beam 18 through grid generator 34 and tuning element 12 to end reflector 26 (end reflector not shown in FIG. 2) as described above.

Figure 3:
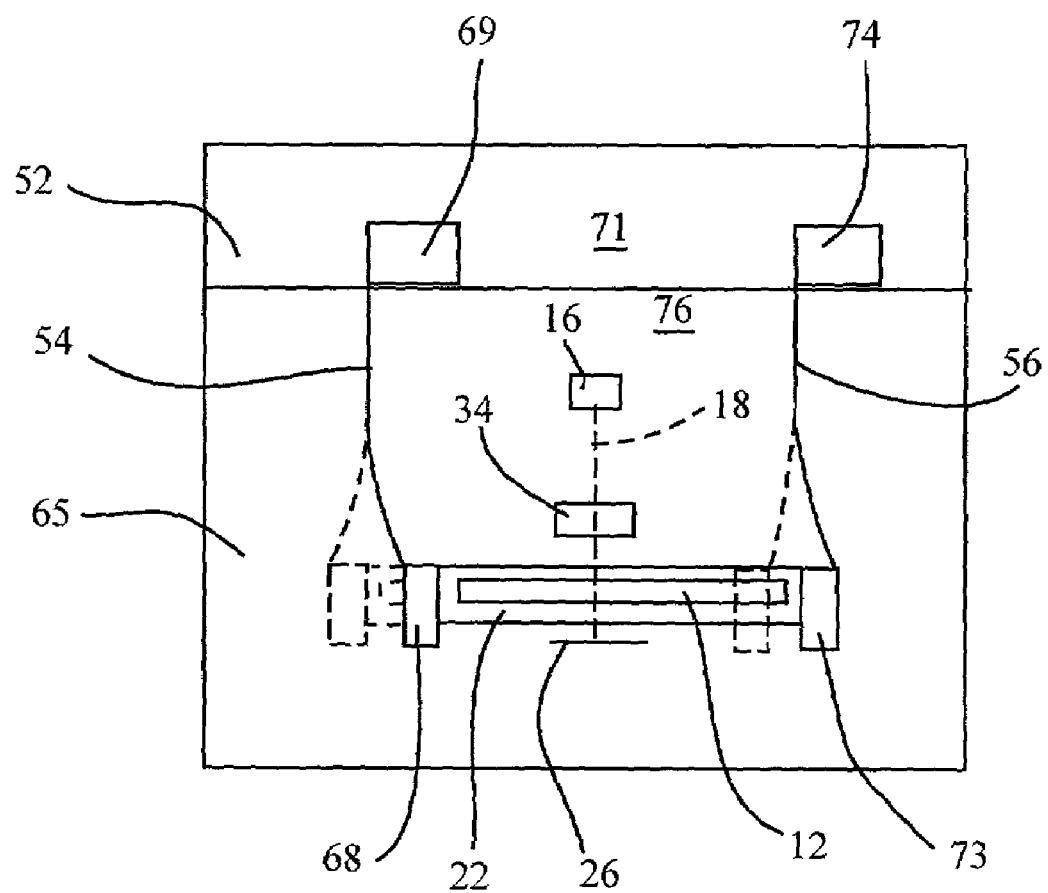
FIG. 3 is a schematic illustration of the motion of the magnetically actuated tuning assembly of FIG. 2 during tuning.

Base plate 71 elevates flexural elements 54, 56 and first magnetic element 22 from the inner surface 76 of container wall 65, such that magnetic element 22 and ends 68, 73 of flexural elements 54, 56 can move without frictional interaction with container wall 65. Referring also to FIG. 3, the motion of tuning element 12, magnetic element 22 and flexural elements 54, 56 during tuning is illustrated. As shown in FIG. 3, the second ends 60, 64 of flexure elements 54, 56 remain generally stationary during the displacement and motion of the first magnetic element 22 and tuning element 12 in response to the motion of the second magnetic element 24 (not shown in FIG. 3). As magnetic element 22 and tuning element 12 move, flexural elements 54, 56 provide a flexural range of motions such that first ends 58, 62, and hence the attached magnetic element 22 and tuning element 12, undergo a range of motion as shown in FIG. 3. This motion changes the position of the tuning element 12 within the light beam 18 allowing controlled tuning of the laser apparatus as described above.

Figure 4:
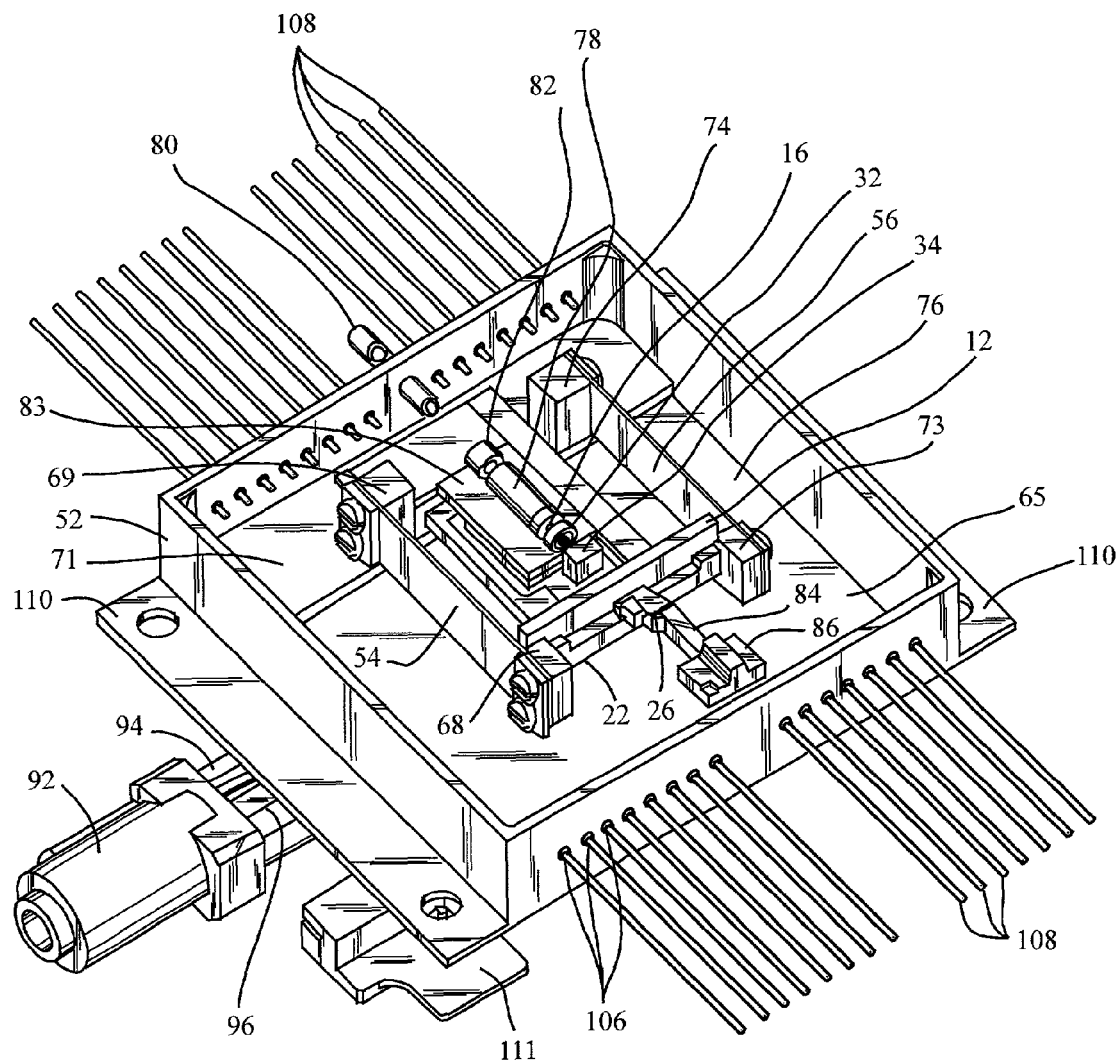
FIG. 4 is a top perspective view of an external cavity laser apparatus with a magnetically coupled drive system for a tuning filter in accordance with the invention.
Figure 5:
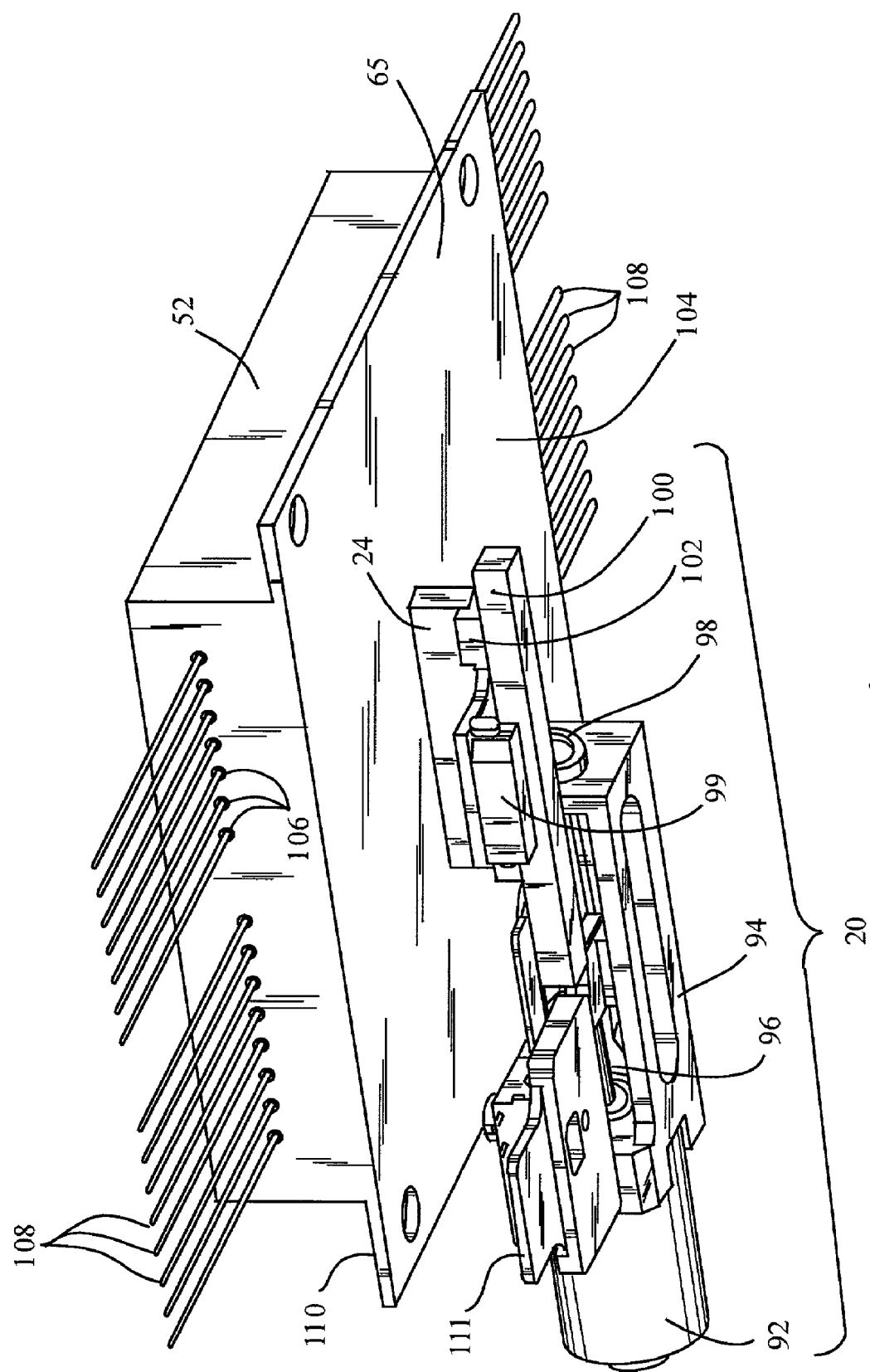
FIG. 5 is a bottom perspective view of the external cavity laser apparatus of FIG. 4.

Referring now to FIG. 4 and FIG. 5, there is shown another embodiment of an external cavity laser apparatus 76, with like reference numbers used to denote like parts. The hermetically sealable container 52 (the container lid is omitted for clarity) permits enclosing an external cavity laser within a contamination-free or low contamination environment, in an inert atmosphere, which protects the various optical surfaces of the laser apparatus, including the anti-reflective (AR) coated facet 30 (FIG. 1) on the gain medium 16, as well as optical surfaces on the end reflector 26, tuning element 12, grid generator 34 and other optical surfaces. The deposition of contaminants onto optical surfaces associated with an external cavity laser, which may occur in the absence of hermetic sealing, can result in aberrations which hinder the performance of the external laser cavity and promote degradation of critical optical surfaces.

In the apparatus 76, gain medium 16 is positioned between collimator 32 and an optical output assembly 78 that receives light output from the rear facet 30 (FIG. 1) of gain medium 16. An optical fiber (not shown) enters container 52 through ferrule 80 and is positioned to receive light from output assembly 78 through collimator 82. Gain medium 16, collimators 32, 82 and output assembly 78 are mounted on a thermal control stage 83 to allow selective thermal control of these components. Such selective heating can be used to prevent condensation of contaminants on optical surfaces, as described in U.S. application Ser. No. 09/900,429 filed on Jul. 6, 2001, the disclosure of which is incorporated herein by reference. End reflector 26, which is shown as a phase modulator in this embodiment, is mounted on an arm 84 that in turn is mounted on a thermal control assembly 86 which allows positioning of end mirror according to thermal expansion and contraction of arm 84. Active thermal positioning of end reflector 26 is described in U.S. application Ser. No. 09/900,443, noted above.

The hermetically sealed enclosure 52 includes an inert atmosphere (not shown), as well as an activated carbon drain 88, and a moisture trap 90 therewithin. Activated carbon drain 88 provides for capture of volatile organic hydrocarbons present in container 52 which could otherwise condense on and contaminate laser optical surfaces. Moisture trap similarly provides for the capture of any water vapor within container which may otherwise condense on and interfere with optical surfaces. The use of an activated carbon drain and moisture trap with a hermetically sealed external cavity laser are described more fully in U.S. application Ser. No. 09/900,423 filed on Jul. 6, 2001, the disclosure of which is incorporated herein by reference.

In the apparatus 76, the first magnetic element 22 and tuning element 12 and other laser components are included within the hermetically sealed enclosure 52, while the second magnetic element 24 and the drive element 20 are located outside the enclosure 52. Drive element 20 includes various components, described further below, which may give rise to outgassing and potential contaminants during operation. The location of laser components within a hermitically sealed enclosure, while drive components are located outside the enclosure, eliminates the risk of laser optical surface contamination by drive components. Referring again to FIG. 1 as well as FIG. 4 and FIG. 5, the laser optical surfaces within hermetic container 52 which are sensitive to contaminants, such as moisture and volatile organics or hydrocarbons, include, but are not limited to, the AR coated facet 28 and reflective facet 30 of gain medium 16, end mirror 26, the reflective faces 36, 38 of the grid etalon 28, the reflective faces 40, 42 of the tuning element 12, and the surfaces of collimating lenses 32, 82 and optical output assembly 78. Various other important optical surfaces of external cavity laser 10 that are not shown and which are contamination sensitive as well include polarizing and dichromic optical components and additional collimating components.

Referring more particularly to FIG. 5, drive element 20 is provided in the form of a stepper motor 92 structured and configured to adjustably position tuning element 12 according to selected channels. Stepper motor 92 is mounted on a motor bracket 94 and turns a threaded shaft 96 mounted in bearing 98 on bracket 94. Threaded shaft 98 drives a slide 99 that moves slidably along a rail 100. Slide 99 is coupled to the second magnetic element 24 by bracket 102. Motor bracket 94 is mounted on the lower or outside surface 104 of container wall 65. As motor 92 turns, threaded shaft 98 drives slide 100 and the attached magnetic element 24 in bracket 102. The movement of magnetic element 24 in turn drives magnetic element 22 and the attached tunable element 12 (FIG. 4) within container 52. Slide 100 and bracket 102 support magnetic element 24 so that it is positioned adjacent to, but not in contact with, lower surface 104 of wall 65, to avoid frictional interaction therewith.

Stepper motor 92, shaft 96 and bearing 98 include lubricants, plasticizers, residual moisture and other volatiles that are capable of outgassing during operation of the apparatus 76. The magnetic coupling provided by magnetic elements 22, 24 allows stepper motor 92 and other drive element components to be located outside of hermetically sealed container 52 to prevent outgassing contamination of the laser components internal to container 52. A controller in the form of an EEPROM chip (not shown) provides for control of stepper motor 92, and may also be located outside enclosure 52 on lower surface 104 of wall 65.

Hermetically sealed container 52 includes holes 106 to allow hermetic sealing of electrical leads 108 extending therethrough by use of electric feedthroughs (not shown). Feedthroughs comprise glass sleeves that fit into holes 106 and through which leads 108 fit. Feedthroughs and leads 108 are hermetically fused into holes 106 by exposure to elevated temperature during fabrication of the apparatus 76. The hermetic sealing of leads 108 in this manner is carried out prior to inclusion of any heat sensitive components within container 52. Mounting flanges 110 on enclosure allow the apparatus to be mounted on a suitable surface (not shown). A photodetector assembly 111 provides for monitoring the position of stepper motor 92 during operation thereof.

The hermetically sealable enclosure 52 is metal plated to prevent rust or corrosion from arising after sealing the external cavity laser 10 within enclosure 52. The hermetically sealed enclosure 52 may be made of KOVAR® Ni—Fe—Co alloy or other metal or metal alloy having good corrosion resistance and formability suitable for hermetic enclosures. Hermetic enclosure 52 may be plated with gold or other corrosion-resistant metal or metal alloy to provide clean, corrosion-resistant surfaces. The enclosure 52 is metal plated under conditions that safeguard against possible contamination, such as class 100 or higher clean room conditions. Where possible, the use of adhesives is avoided within hermetic container 52, and fluxless solders are utilized for bonding. Circuit boards (not shown) that are placed inside the container 52 for thermal control or other control purposes are made of ceramic instead of fiberglass-reinforced resin, to avoid outgassing associated with resin-containing boards, and are attached directly to the container 52 by a fluxless solder process. The hermetically container lid (not shown) conforms generally to the shape of container 52, and includes a Ni—Au plating to allow for hermetic sealing to container 52 to form a hermetically sealed enclosure about the laser components therewithin. Further details on hermetically sealing specific elements of the laser apparatus of the present invention are described in U.S. application Ser. No. 09/900,423, noted above.

In the embodiments of the invention shown in FIG. 2 through FIG. 5, the first magnetic element 22 or the second magnetic element 24 are not in direct contact with the surfaces of the hermetically sealable container 52. This configuration avoids frictional interaction between the magnetic elements 22, 24 and wall 65 of container 52. In other embodiments of the invention, however first and/or second magnetic element 22, 24 may be in contact with wall 65 or other part of container 52. Grooves or tracks (not shown) may be provided in wall 65 to accommodate and guide magnetic element 22 and/or 24 during actuation. A linear bearing assembly (not shown) may be provided to accommodate one or both of magnetic elements 22, 24. A linear bearing located within enclosure for magnetic element 22 would preferably avoid the use of lubricants that may outgas, and may include, for example, TEFLON®-coated bearing surfaces. The use of grooves and/or linear bearing would eliminate the need for flexures 54, 56, as the magnetic elements 22, 24 could be adequately supported in a suitable groove or linear bearing assembly.

Numerous variations of the magnetic coupling of the invention may alternatively be used for actuation of tuning element. For example, where a pivotally movable grating is used as a tuning element, drive element 20 and magnetic elements 22, 24 may be configured to provide suitable rotational, rather than translational, actuation to the tuning element. In embodiments wherein a stationary grating is used in conjunction with a movable mirror as a tuning element, such as a Littman-Metcalf external cavity laser, drive element 20 and magnetic elements 22, 24 may be configured to provide both rotational and translation motion to the movable mirror. In this regard, the magnetic elements 22, 24 may be movably associated with a single pivot point which extends through a wall of the hermetically sealed enclosure, with magnetic elements 22, 24 each mounted on a movable arm pivotally mounted at the pivot point. Various other magnetic coupling arrangements will suggest themselves to those skilled in the art upon review of this disclosure, and are also considered to be within the scope of the invention.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. An optical apparatus, comprising:
 a tuning etalon positioned in a light beam, the tuning etalon to define a wavelength grid for the optical apparatus;
 a tuning element positioned in the light beam, the tuning element to select from among multiple communication channels; and
 a drive element magnetically coupled to said tuning etalon.

2. The apparatus of claim 1, further comprising a hermetically sealed enclosure, said tuning etalon positioned within said hermetically sealed enclosure, said drive element located outside said hermetically sealed enclosure.

3. The apparatus of claim 2, further comprising:
 (a) a first magnetic element coupled to said tuning etalon and located within said hermetically sealed enclosure; and
 (b) a second magnetic element associated with said drive element and located outside said hermetically sealed enclosure, said first magnetic element magnetically coupled to said second magnetic element through said hermetically sealed enclosure.

4. The apparatus of claim 1, further comprising a gain medium, said gain medium emitting said light beam.

5. The apparatus of claim 4, further comprising a reflector positioned in said light beam after said tuning etalon.

6. The apparatus of claim 5, further comprising a hermetically sealed enclosure, said gain medium, said tuning etalon, and said reflector positioned within said hermetically sealed enclosure, said drive element located outside said hermetically sealed enclosure.

7. A laser apparatus, comprising:
 a gain medium;
 a tuning etalon positioned in a light beam emitted by said gain medium, the tuning etalon to define a wavelength arid for the optical apparatus;
 a tuning element positioned in the light beam, the tuning element to select from among multiple communication channels;
 a first magnetic element operatively coupled to said tuning etalon; and
 a second magnetic element magnetically coupled to said first magnetic element and configured to actuate said first magnetic element and said tuning etalon according to actuation of said second magnetic element.

8. The apparatus of claim 7, further comprising a drive element coupled to said second magnetic element and configured to actuate to said second magnetic element.

9. The apparatus of claim 7, further comprising a reflector positioned in said light beam after said tuning etalon.

10. The apparatus of claim 7, further comprising a grid generator positioned in said light beam.

11. The apparatus of claim 7, further comprising a hermetically sealed enclosure, said gain medium, said tuning etalon and said first magnetic element positioned within said hermetically sealed enclosure, said second magnetic element located outside said hermetically sealed enclosure.

12. The apparatus of claim 11, further comprising an activated carbon drain positioned within said hermetically sealed enclosure.

13. The apparatus of claim 11, further comprising a moisture trap positioned within said hermetically sealed enclosure.

14. The apparatus of claim 11, wherein hermetically sealed enclosure contains an inert atmosphere.

15. A laser apparatus, comprising
 a gain medium emitting a light beam;
 a tuning etalon positioned in said light beam, the tuning etalon to define a wavelength grid for the optical apparatus;
 a tuning element positioned in the light beam, the tuning element to select from among multiple communication channels;
 a drive assembly magnetically coupled to said tuning etalon; and
 a hermetically sealed container, said gain medium and said tuning etalon located within said hermetically sealed container, said drive assembly located outside said hermetically sealed container.

16. The apparatus of claim 15, further comprising;
 (a) a first magnetic element coupled to said tuning etalon and located within said hermetically sealed container; and
 (b) a second magnetic element associated with said drive assembly and located outside said hermetically sealed container, said first magnetic element magnetically coupled to said second magnetic element through said hermetically sealed container.

17. The apparatus of claim 15, further comprising a reflector located within said hermetically scaled container and positioned in said beam after said tuning etalon.

18. The apparatus of claim 17, further comprising a grid generator located within said hermetically sealed container and positioned in said beam.

19. The apparatus of claim 15, further comprising an activated carbon drain positioned within said hermetically sealed container.

20. The apparatus of claim 15, further comprising a moisture trap positioned within said hermetically sealed container.

21. The apparatus of claim 15, wherein hermetically sealed container includes an inert atmosphere therewithin.

22. A method for operating a laser, comprising:
 positioning a tuning etalon in a light beam;
 defining a wavelength grid for the optical apparatus with the tuning etalon;
 positioning a tuning element in the light beam;
 selecting from among multiple communication channels using the tuning element;
 magnetically coupling a drive element to said tuning etalon; and
 actuating said tuning etalon via magnetic coupling between said tuning etalon and said drive element.

23. The method of claim 22, wherein said magnetically coupling comprises:
 (a) coupling a first magnetic element to said tuning etalon;
 (b) coupling a second magnetic element to said drive element; and (c) positioning said first and second magnetic elements such that actuation of said second magnetic element by said drive element results in actuation of said first magnetic element and said tuning etalon.

24. The method of claim 22, further comprising:
(a) enclosing said tuning etalon in a hermetically sealed container; and
(b) positioning said drive element outside said hermetically sealed container.

25. The method of claim 24, wherein said magnetically coupling is carried out through a wall of said hermetically sealed container.

26. The method of claim 22, further comprising providing a gain medium, said gain medium emitting said light beam.

27. The method of claim 26, further comprising positioning a reflector positioned in said light beam after said tuning etalon.

28. The method of claim 26, further comprising positioning a grid generator in said light beam.

29. The method of claim 27, further comprising:
(a) enclosing said tuning etalon, said gain medium and said reflector in a hermetically sealed container;
(b) positioning said drive element outside said hermetically sealed container.

30. A method for operating a laser, comprising:
positioning a tuning etalon in a light beam;
defining a wavelength grid for the optical apparatus with the tuning etalon;
positioning a tuning element in the light beam;
selecting from among multiple communication channels using the tuning element;
coupling a first magnetic element to said tuning etalon;
coupling a second magnetic element to a drive element; and
positioning said first and second magnetic elements such that said tuning etalon and said drive element are magnetically coupled to each other.

31. The method of claim 30, further comprising actuating said tuning element via interaction of said magnetically coupled first and second magnetic elements.

32. The method of claim 30, further comprising:
(a) positioning said tuning etalon and said first magnetic element within a hermetically sealed enclosure; and
(b) positioning said drive element and said second magnetic element outside said hermetically sealed enclosure.

33. The method of claim 32, further comprising:
(a) providing a gain medium, said gain medium emitting said light beam;
(b) positioning a reflector positioned in said light beam after said tuning element; and
(c) positioning said gain medium and said reflector within said hermetically sealed enclosure.

34. An optical apparatus, comprising:
means for generating a light beam in the optical apparatus, the optical apparatus having:
a tuning etalon positioned in said light beam, the tuning etalon to define a wavelength grid for the optical apparatus; and
a tuning element positioned in the light beam, the tuning element to select from among multiple communication channels; and
means for magnetically actuating a tuning etalon positioned in said light beam.

35. The apparatus of claim 34, further comprising means for hermetically enclosing said light beam generating means and said tuning etalon.

* * * * *